United States Patent [19]

Rudolph

[11] Patent Number: 4,996,699

[45] Date of Patent: Feb. 26, 1991

[54] DIGITALLY SETTABLE FREQUENCY DIVIDER, ESPECIALLY FOR A FREQUENCY SYNTHESIZER

[75] Inventor: Georg Rudolph, Eningen, Fed. Rep. of Germany

[73] Assignee: Wandel & Goltermann GmbH & Co., Eningen, Fed. Rep. of Germany

[21] Appl. No.: 378,387

[22] Filed: Jul. 11, 1989

[30] Foreign Application Priority Data

Jul. 30, 1988 [DE] Fed. Rep. of Germany ....... 3826006

[51] Int. Cl.$^5$ ............................................. G06F 7/60
[52] U.S. Cl. ...................................... 377/49; 377/48; 377/51; 364/703
[58] Field of Search ................... 364/703; 377/47, 48, 377/49, 50, 51

[56] References Cited

U.S. PATENT DOCUMENTS

| | | | |
|---|---|---|---|
| 4,234,929 | 11/1980 | Riley | 364/703 |
| 4,458,329 | 7/1984 | Remy | 364/703 |
| 4,555,793 | 11/1985 | Benamy | 377/48 |
| 4,573,023 | 2/1986 | Cok et al. | 377/48 |
| 4,694,475 | 9/1987 | Mehrgardt | 377/49 |
| 4,870,366 | 9/1989 | Pelletier | 364/703 |

FOREIGN PATENT DOCUMENTS

| | | |
|---|---|---|
| 0125790 | 11/1984 | European Pat. Off. . |
| 0202347 | 11/1986 | European Pat. Off. . |
| 2240216 | 3/1974 | Fed. Rep. of Germany . |
| 3210048 | 9/1982 | Fed. Rep. of Germany . |
| 3544371 | 6/1987 | Fed. Rep. of Germany . |
| 2431800 | 2/1980 | France . |
| 8605046 | 8/1986 | PCT Int'l Appl. . |

Primary Examiner—John S. Heyman
Attorney, Agent, or Firm—Herbert Dubno

[57] ABSTRACT

A frequency divider circuit, especially for use in frequency synthesizers, in which the frequency divider is provided with whole-number division factors, permits intergrator, differentiator and/or phase accumulations to be used to generate the successive values of the division factor which average, over time to allow fractional frequency division.

15 Claims, 5 Drawing Sheets

PRIOR ART

| phase q(i) | quantization q(i) | division factor m(i) |
|---|---|---|
| 9.10 | 9 | 9 |
| 18.20 | 18 | 9 |
| 27.30 | 27 | 9 |
| 36.40 | 36 | 9 |
| 45.50 | 45 | 9 |
| 54.60 | 54 | 9 |
| 63.70 | 63 | 9 |
| 72.80 | 72 | 9 |
| 81.90 | 81 | 9 |
| 91.00 | 91 | 10 |
| 100.10 | 100 | 9 |
| 109.20 | 109 | 9 |
| 118.30 | 118 | 9 |
| 127.40 | 127 | 9 |
| 136.50 | 136 | 9 |
| 145.60 | 145 | 9 |
| 154.70 | 154 | 9 |
| 163.80 | 163 | 9 |
| 172.90 | 172 | 9 |
| 182.00 | 182 | 10 |
| 191.10 | 191 | 9 |
| 200.20 | 200 | 9 |

PRIOR ART

| fract phase p(i) | sum p(i-1)+F | division factor m(i) |
|---|---|---|
| 0.10 | 9.10 | 9 |
| 0.20 | 9.20 | 9 |
| 0.30 | 9.30 | 9 |
| 0.40 | 9.40 | 9 |
| 0.50 | 9.50 | 9 |
| 0.60 | 9.60 | 9 |
| 0.70 | 9.70 | 9 |
| 0.80 | 9.80 | 9 |
| 0.90 | 9.90 | 9 |
| 0.00 | 10.00 | 10 |
| 0.10 | 9.10 | 9 |
| 0.20 | 9.20 | 9 |
| 0.30 | 9.30 | 9 |
| 0.40 | 9.40 | 9 |
| 0.50 | 9.50 | 9 |
| 0.60 | 9.60 | 9 |
| 0.70 | 9.70 | 9 |
| 0.80 | 9.80 | 9 |
| 0.90 | 9.90 | 9 |
| 0.00 | 10.00 | 10 |
| 0.10 | 9.10 | 9 |
| 0.20 | 9.20 | 9 |

| fract. phase p(i) | integral of fract. phase $s_1(i)$ | integral integral of fract. phase $s_2(i)$ | whole part q(i) | $d_1(i)$ | $d_2(i)$ | $d_3(i)$ | frequency component $m_o(i)$ | division factor m(i) | phase errors |
|---|---|---|---|---|---|---|---|---|---|
| 0.10 | 0.10 | 0.10 | 0 | 0 | 0 | 0 | 9 | 9 | 0.10 |
| 0.20 | 0.30 | 0.40 | 0 | 0 | 0 | 0 | 9 | 9 | 0.20 |
| 0.30 | 0.60 | 1.00 | 1 | 1 | 0 | 1 | 9 | 10 | -0.70 |
| 0.40 | 1.00 | 2.00 | 2 | 1 | 1 | 0 | 9 | 8 | -0.40 |
| 0.50 | 1.50 | 3.50 | 3 | 1 | 0 | 0 | 9 | 9 | 0.50 |
| 0.60 | 2.10 | 5.60 | 5 | 2 | 1 | 1 | 9 | 10 | -0.40 |
| 0.70 | 2.80 | 8.40 | 8 | 3 | 1 | 0 | 9 | 9 | -0.30 |
| 0.80 | 3.60 | 12.00 | 12 | 4 | 1 | 0 | 9 | 9 | -0.20 |
| 0.90 | 4.50 | 16.50 | 16 | 4 | 0 | 1 | 9 | 8 | 0.90 |
| 1.00 | 4.50 | 21.00 | 21 | 5 | 1 | 1 | 0 | 11 | -1.00 |
| 0.10 | 4.60 | 25.60 | 25 | 4 | -1 | -2 | 9 | 7 | 1.10 |
| 0.20 | 4.80 | 30.40 | 30 | 5 | 1 | 2 | 9 | 11 | -0.80 |
| 0.30 | 5.10 | 35.50 | 35 | 5 | 0 | -1 | 9 | 8 | 0.30 |
| 0.40 | 5.50 | 41.00 | 41 | 6 | 1 | -1 | 9 | 10 | -0.60 |
| 0.50 | 6.00 | 47.00 | 47 | 6 | 0 | -1 | 9 | 8 | -0.50 |
| 0.60 | 6.60 | 53.60 | 53 | 6 | 0 | 0 | 9 | 9 | 0.60 |
| 0.70 | 7.30 | 60.90 | 60 | 7 | 1 | 1 | 9 | 10 | -0.30 |
| 0.80 | 8.10 | 69.00 | 69 | 9 | 2 | -1 | 9 | 10 | -1.20 |
| 0.90 | 9.00 | 78.00 | 78 | 9 | 0 | -2 | 9 | 7 | 0.90 |
| 1.00 | 9.00 | 87.00 | 87 | 9 | 0 | 0 | 0 | 10 | 0.00 |
| 0.10 | 9.10 | 96.10 | 96 | 9 | 0 | 0 | 9 | 9 | 0.10 |
| 0.20 | 9.30 | 105.40 | 105 | 9 | 0 | 0 | 9 | 9 | 0.20 |
| 0.30 | 9.60 | 115.00 | 115 | 10 | 1 | 1 | 9 | 10 | -0.70 |

| fract. phase p(i) | integral of fract. phase p₁(i) | integral of integral of fract.phase p₂(i) | frequency component m₀(i) | m₁(i) | m₂(i) | partial value m(i) | phase error |
|---|---|---|---|---|---|---|---|
| 0.10 | 0.10 | 0.10 | 9 | 0 | 0 | 9 | 0.10 |
| 0.20 | 0.30 | 0.40 | 9 | 0 | 0 | 9 | 0.20 |
| 0.30 | 0.60 | 0.00 | 9 | 0 | 1 | 10 | -0.70 |
| 0.40 | 0.00 | 0.00 | 9 | 1 | 0 | 8 | 0.40 |
| 0.50 | 0.50 | 0.50 | 9 | 0 | 0 | 9 | 0.50 |
| 0.60 | 0.10 | 0.60 | 9 | 1 | 0 | 10 | -0.40 |
| 0.70 | 0.80 | 0.40 | 9 | 0 | 1 | 9 | -0.30 |
| 0.80 | 0.60 | 0.00 | 9 | 1 | 1 | 9 | -0.20 |
| 0.90 | 0.50 | 0.50 | 9 | 1 | 0 | 8 | 0.90 |
| 0.00 | 0.50 | 0.00 | 10 | 0 | 1 | 11 | -1.00 |
| 0.10 | 0.60 | 0.60 | 9 | 0 | 0 | 7 | 1.10 |
| 0.20 | 0.80 | 0.40 | 9 | 0 | 1 | 11 | -0.80 |
| 0.30 | 0.10 | 0.50 | 9 | 1 | 0 | 8 | 0.30 |
| 0.40 | 0.50 | 0.00 | 9 | 0 | 1 | 10 | -0.60 |
| 0.50 | 0.00 | 0.00 | 9 | 0 | 0 | 8 | 0.50 |
| 0.60 | 0.60 | 0.60 | 9 | 0 | 0 | 9 | -0.50 |
| 0.70 | 0.30 | 0.90 | 9 | 1 | 0 | 10 | -0.30 |
| 0.80 | 0.10 | 0.00 | 9 | 1 | 1 | 10 | -1.20 |
| 0.90 | 0.00 | 0.00 | 9 | 1 | 0 | 7 | 0.90 |
| 0.00 | 0.00 | 0.00 | 10 | 1 | 0 | 10 | 0.00 |
| 0.10 | 0.10 | 0.10 | 9 | 0 | 0 | 9 | 0.10 |
| 0.20 | 0.30 | 0.40 | 9 | 0 | 0 | 9 | 0.20 |
| 0.30 | 0.60 | 0.00 | 9 | 0 | 1 | 10 | -0.70 | ns
DIGITALLY SETTABLE FREQUENCY DIVIDER, ESPECIALLY FOR A FREQUENCY SYNTHESIZER

FIELD OF THE INVENTION

My present invention relates to a frequency divider arrangement for producing a certain frequency from a given frequency utilizing a frequency divider settable only to whole-number divisor factors and which can be used to control a frequency synthesizer.

BACKGROUND OF THE INVENTION

As will be described in greater detail hereinafter, frequency divider methods and devices can be used to control frequency synthesizers operating in phase-locked loop (PLL-loop) circuitry in which the phase-locked loop circuit is provided for an oscillator.

Reference may be had to German Open Application DE-OS 35 44 371 and to the commonly owned U.S Pat. No. 4,697,156 which discloses a frequency synthesizer having an oscillator provided with a phase-locked loop utilizing fractional frequency divider control.

In German Open Application DE-OS 32 10 048, like German Open Application DE-OS 35 44 371, it is possible to obtain a fine frequency resolution in spite of a high keying frequency by a periodic adjustment of the frequency divider factor by +1 or by −1, for example so that the frequency divider which can be set only with integral (whole-number) frequency division factors m can have a frequency division effect which changes with time.

The requisite calculation of the frequency divider factor m in the case of the aforementioned patent and German Open Application 35 44 371, is accommodated utilizing a so-called phase accumulator while in German Open Application DE-OS 22 40 216, a similar effect is obtained by a synchronous divider chain. Upon overflow of the phase accumulator, to the whole number value of the frequency divider factor, +1 or −1 may be added.

In the German Patent Document DE-OS 22 40 216, the modification of the frequency divider factor by +1 (or by −1) is effected by a pulse-suppression circuit or by a pulse-injection circuit which is enabled upon each overflow of the synchronous divider chain to provide a single increment.

A frequency divider with periodic adjustment of the frequency divider factor m by +1 or −1 can also be termed a "fractional frequency divider" and a phase-locked loop which includes such a frequency divider can correspondingly be referred to as a "fractional synthesizer."

These systems will be discussed in greater detail below with reference to the drawing.

It suffices, at this point, to mention only the references previously described briefly and to observe that in the prior art devices, phase errors may be compensated with analog means. The effect of the compensation is, as a result, a function of the linearity and slope variations of the circuit elements which operate in the analog sense.

OBJECTS OF THE INVENTION

It is, therefore, the principal object of my present invention to provide a frequency divider method which extends the principles of the commonly owned prior patent 4,697,156 which corresponds to the German Open Application DE-OS 35 44 371.

Another object of this invention is to provide a frequency divider circuit for use in phase-locked loop control of an oscillator, especially for frequency synthesizers as in the above-mentioned patent, which avoids certain drawbacks which have been encountered in such circuitry and in other prior art devices as have been described or may be described below.

It is also an object of my invention to provide an improved frequency divider method or circuit which will overcome the disadvantages of prior art systems and, particularly, will provide improved compensation without the drawbacks and disadvantages of prior analog systems.

SUMMARY OF THE INVENTION

These objects and others which will become more apparent hereinafter are attained, in accordance with the present invention, in a frequency divider method for generating a frequency $f_T$ from a given frequency $f_O$ with a frequency divider settable only to whole-number divisor factors m and wherein on the average for a whole or fractional frequency division ratio is realized by a new setting of m to correspond to a frequency-setting information datum, and whereby a control circuit is provided which includes a phase accumulator supplied with the fractional component of the frequency-setting datum and clocked by the divider output signal $f_T$ or a signal synchronous therewith and for each frequency-division cycle a new value m is supplied the sequence of frequency-divider factors m being calculated in real time or read from a memory when the sequence is periodic and the terms of the sequence each have two components of which a first component is constituted of the sum of the whole parts of the frequency-setting information F and is a transfer from the phase accumulator, and of which a second component is calculated from the stored contents of the phase accumulator, the improvement wherein the second component, in order to reduce the spectral part of the phase perturbations falling in the vicinity of $f_T$ in consideration of the more remote spectral parts and an increase in the absolute value of the phase perturbations to greater than 2(n−1) periods $1/f_O$ measured peak-to-peak, is calculated as follows:

integrating the contents of the phase accumulator n times, where n=2, 3, ...., in digital integrators with the input x and the output y defined by the recursion formula $y(i)=y(i-1)+x(i)$ to provide an integrated result;

cutting off the integrated result to yield an integer value; and differentiating the integer value n+1 times in digital differentiators with the input x and the output y defined by the formula $y(i)=x(i)-x(i-1)$, the integrators, the differentiators and the phase accumulator being operated synchronously with the same computing cycle.

According to a feature of the invention, the integrated value is calculated with a reduced word length by operating upon a fractional part thereof.

The contents of the phase accumulator (n) can be integrated in at least two integrators and the integrated value can be differentiated in at least three differentiators in accordance with this invention.

Lower value settings of the fractional parts of the integrated values can be calculated at a reduced cycling frequency. The frequency divider method and circuit of the invention can be used to operate or form an adjustable frequency divider in a phase-control loop of a frequency synthesizer and the frequency divider method can generate the desired frequency $f_T$ by dividing a frequency $f_O$ and subsequently subjecting the divided frequency $f_T$ to pass-band filtration.

The integration can be foreshortened with the differentiation for whole values of the integrated values.

In another aspect, the invention resides in an improvement in a frequency divider method. The method thus generates a frequency $f_T$ from a given frequency $f_O$ with a frequency divider settable only to whole-number divisor factors m and wherein on the average for a whole or fractional frequency division ratio is realized by a new setting of m to correspond to a frequency-setting information datum, and whereby a control circuit is provided which includes a phase accumulator supplied with the fractional component of the frequency-setting datum and clocked by the divider output signal $f_T$ or a signal synchronous therewith and for each frequency-division cycle a new value m is supplied, the sequence of frequency-divider factors m being calculated in real time or read from a memory when the sequence is periodic and the terms of the sequence each have two components of which a first component is constituted of the sum of the whole parts of the frequency-setting information F and is a transfer from the phase accumulator, and of which a second component is calculated from the stored contents of the phase accumulator, the improvement wherein the second component, in order to reduce the spectral part of the phase perturbations falling in the vicinity of $f_T$ in consideration of the more remote spectral parts and an increase in the absolute value of the phase perturbations to greater than $2(n-1)$ periods $1/f_O$ measured peak-to-peak, is calculated as follows:

subjecting the contents of the phase accumulator to digital filtration with a transfer function having at least two poles and with $f=0$ and $z=1$ to provide an integrated result;

cutting off the integrated result to yield an integer value; and subjecting the integer value to digital filtration with a filter function having integral coefficients and at least two zero crossings of a transfer function with $f=0$ and $z=1$, the digital filtrations and the phase accumulator being operated synchronously with the same computing cycle.

A frequency divider circuit according to the invention, comprises:

a frequency divider settable only to whole-number divisor factors m and wherein on the average for a whole or fractional frequency division ratio is realized by a new setting of m to correspond to a frequency-setting information datum; and a control circuit including a phase accumulator operatively connected to the frequency divider and supplied with the fractional component of the frequency-setting information datum and clocked by the divider output signal $f_T$ or a signal synchronous therewith and for each frequency-division cycle supplying a new value m, the sequence of frequency-divider factors m being calculated in real time or read from a memory when the sequence is periodic and the terms of the sequence each having two components of which a first component is constituted of the sum of the whole parts of the frequency-setting information F and is a transfer from the phase accumulator, and of which a second component is calculated from the stored contents of the phase accumulator, the control means further comprising means whereby the second component, in order to reduce the spectral part of the phase perturbations falling in the vicinity of $f_T$ in consideration of the more remote spectral parts and an increase in the absolute value of the phase perturbations to greater than $2(n-1)$ periods $1/f_O$ measured peak-to-peak, is calculated as follows:

integrating the contents of the phase accumulator n times, where $n=2, 3, \ldots$, in digital integrators with the input x and the output y defined by the recursion formula $y(i)=y(i-1)+x(i)$ to provide an integrated result;

cutting off the integrated result to yield an integer value; and differentiating the integer value $n+1$ times in digital differentiators with the input x and the output y defined by the formula $y(i)=x(i)-x(i-1)$, the integrators, the differentiators and the phase accumulator being operated synchronously with the same computing cycle.

The invention, therefore, makes use of the fact that each mean (fractional) frequency division factor can be realized by very many different sequences of whole-number or integral frequency divider factors m. This degree of freedom can be utilized to varying degrees so that such a sequence can be generated and used as will fall directly in the region of $f_A$ so that the spectral portion directly in the region of $f_A$ is at a minimum or is reduced to a minimum. For example, if a nonfractional frequency setting datum corresponds to $F=10.0$, for example, corresponding to an integral mean frequency divider factor of $m=10.0$, this value can be achieved not only by a sequence of the equal whole-number frequency divider factors 10, 10, ... 10, but also by a multiplicity of other sequences, for example, by a sequence 9, 11, 9, 11, ..., or also by the sequence 8, 12, 8, 12, ..., or eVen by a sequence such as 10, 10, 9. 10, 10, 11, 10, 10, 9, 10, 10, 11 ..., or even other sequences having as a mean value or average value the value 10. As a practical matter, there are innumerable possibilities along these lines.

The same holds true, of course, for fractional frequency information F.

A filter or a phase-locked loop can thus be speedily varied to suit the requirements by adjustment of the division factor in this manner. Any phase errors which thus result which may be used as the input to the phase measuring circuit will be increased by comparison with the phase errors generated with conventional systems utilizing simple fractional control of the frequency divider However, with increasing deviation, the spectrum will be improved so that with increasing modulation in the direct vicinity of the spectral line $f_A$ there will be an increasingly weaker spectral component. The spread of the spectrum, of course, need not pose a problem since a filter can be provided, for example a phase-locked loop filter, to reduce or eliminate this effect.

Consequently, the characteristic of the sequence of the frequency divider factors which will be acceptable will depend on the filtration which can be provided for the value of $f_T$.

In fractional synthesizers, the possibility of utilizing various sequences of frequency divider factors with high control effect, makes it possible to greatly damp deviations when applied to the output signal of the voltage controlled oscillator (VCO) and thereby ensure a precise characteristic of the transfer function.

BRIEF DESCRIPTION OF THE DRAWING

The above objects, features and advantages of my invention will become more readily apparent from the following description, reference being made to the accompanying highly diagrammatic drawing in which:

FIG. 3 is a table of normalized frequency setting information where F=9.1 showing the values arising with the circuit of FIG. 2;

FIG. 5 is a table similar to that of FIG. 5 showing the normalized frequency setting information for F=9.1 with the values as they arise in the circuit of FIG. 4;

FIG. 7 is a table showing the single values for the circuit of FIG. 6 for the case in which F=9.1;

FIG. 9 is a table similar to that of FIG. 8, but showing the signal values in the case of F=9.1 obtained with the circuit of FIG. 8.

SPECIFIC DESCRIPTION

FIGS. 1 through 5 have been provided as illustrative of the prior art and to contrast the prior art with the system of the present invention.

Figure 1:
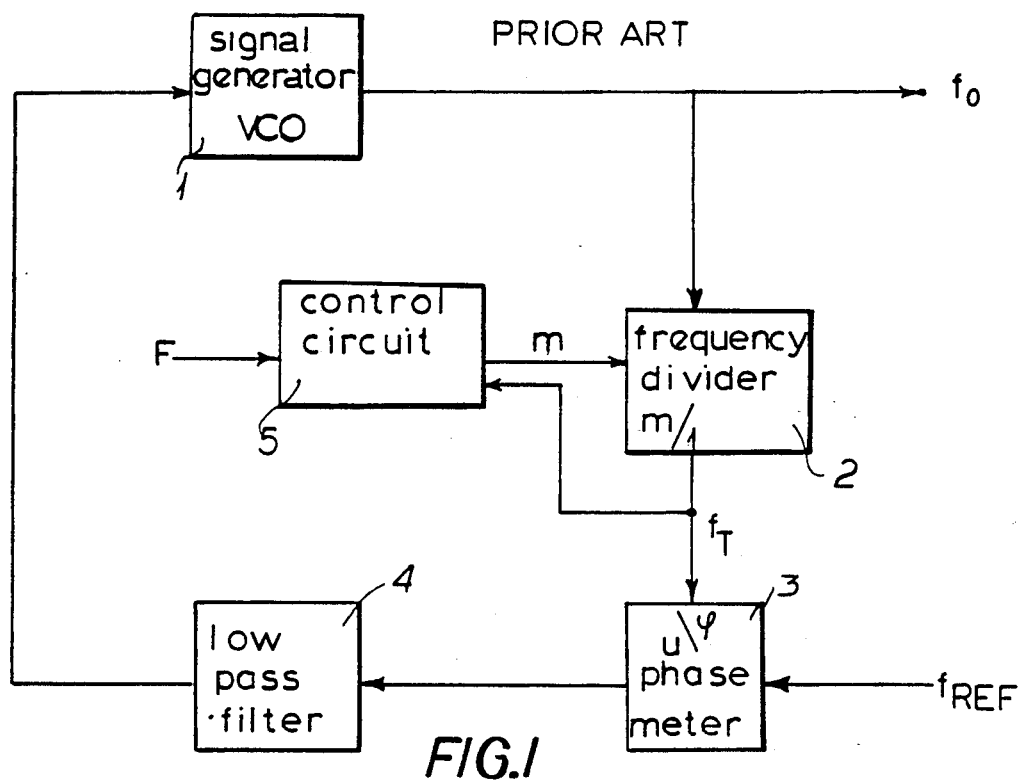
FIG. 1 is a block diagram of a synthesizer of the type described in German Patent Document DE-OS 35 44 371 and my U.S. Pat. No. 4,697,156, utilizing a fractional frequency divider control and illustration in order to provide a proper background for the instant improvement.

The simplified circuit diagram of FIG. 1 illustrates a synthesizer with a frequency divider arrangement as has been described in connection with German Patent Document DE-OS 35 44 371 and my U.S. Pat. No. 4,697,156, a voltage controlled oscillator or VCO 1 generates a desired output signal $f_O$. It is connected in a phase-pointed frequency control loop generally referred to as a phase-locked loop or PLL, together with a frequency divider 2, a phase meter 3 and a low-pass filter 4.

The frequency divider 2 is settable only with whole number or integral frequency divider factors m.

The phase meter 3, also referred to as a phase comparator, is supplied with a reference frequency $f_{REF}$ and the low-pass filter 4 is provided with a controller.

The phase-locked loop circuit is, in turn, provided with a controller 5 which has its output connected to the control input of the frequency divider 2.

The frequency division output frequency $f_T$ is outputted by the frequency divider 2 from the input frequency $f_O$ to be divided and supplied by the VCO 1 and clocks the control circuit 5.

The mean value $f_T$ of the frequency divider output frequency $f_T$ is referred to subsequently as the keying frequency $f_A = f_T$.

The control circuit 5 determines for each frequency division cycle, a characteristic whole-number frequency division factor m and thus adjusts the frequency divider correspondingly so that the sequence of frequency divider factors as a function of time is equal to the frequency setting information f applied to the control circuit 5.

The frequency divider output frequency $f_T$ is compared by the phase meter 3 with the reference frequency $f_{REF}$. The deviations outputted from the phase meter are fed via the low-pass filter and controller 4 to the VCO to close the control circuit.

In the resonant state, the keying frequency $f_A$ is equal to the reference frequency $f_{REF}$ so that:

$$f_{REF} = f_A = f_O/F = f_T$$

The frequency information F inputted to the control circuit 5 also sets the frequency divider input frequency $f_O$ which is normalized to the reference frequency $f_{REF}$.

In the prior art circuits as described in DE-OS 35 44 371 and DE-OS 32 10 048, a desired fine frequency resolution is obtainable in spite of a high keying frequency $f_A$ by periodic resetting of the frequency divider factor by $+1$ or $-1$ so that the frequency divider 2, which can only be set to whole-number frequency divider factors m, generates a fractional frequency division when averaged over time.

The requisite calculation of the frequency divider factor m in the case of DE-OS 35 44 371 makes use of a so-called phase accumulator as noted, while the calculation in DE-OS 22 40 216 is a result of the use of a synchronous divider chain.

Upon overflow of the phase accumulator to the whole component of the frequency divider factor, $+1$ or $-1$ is added. In the arrangement of DE-OS 22 40 216, the modification of the frequency divider factor by $+1$ or $-1$ is effected by a pulse suppression circuit or a pulse injection circuit, respectively, actuated by overflow of the synchronous divider chain.

Figure 2:
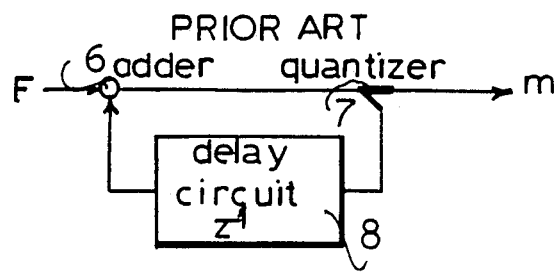
FIG. 2 is a block diagram of a frequency divider control with a so-called phase accumulator also belonging to the prior art.

FIG. 2 shows a frequency divider control utilizing a phase accumulator for a selected frequency resolution. The frequency setting information $F = f_O/f_A$ is formed in an adder 6. The sum is resolved in a quantizer 7 into a whole and a fractional component. The relatively thick branch illustrated shows the path of the whole component forming the value of the instantaneous frequency division factor m with which the frequency division is set.

The other branch p(i) directs the fractional component to a delay circuit 8 connected to the second input of the adder 6 and, at the cadence of the frequency divider output frequency $f_T$, sums the fractional component with the frequency setting information until the output reaches a whole number and thus by unity increases the frequency divider factor m which leaves the accumulator.

The fractional component p(i) represents the deviation of the frequency divider output frequency from the desired ideal keying frequency. The phase is so corrected that it never spans more than the value of a whole oscillation.

With the normalized time i $$i = 1, 2, 3 \ldots = t f_A, 2t f_A, 3t f_A, \ldots,$$

the effect of the frequency divider control of FIG. 2 is determined by the recursive equations $$F = f_o/f_A \quad \text{(normalized)}$$
$$p(i) = (p(i - 1) + F) \bmod 1 \quad \text{(phase accumulation)}$$
$$m(i) = (p(i - 1) + F) - ((p(i - 1) + F) \bmod 1 \quad \text{(division factor)}$$

The delay 8 can comprise a number of D-flip flops which are not further described and which are clocked with the frequency divider output frequency $f_T$. It effects a delay of the digital signal applied thereto by a period of the keying frequency $f_A$ and thus has a transit time of $1/f_A$.

The equality $z = e^{j2\pi f/f_A}$ describes the transfer function of the delay 8 in terms of a fourier transform or z-transform as is customary for a digital filter as is the converse transverse function $z^{-1} = e^{-j2\pi f/f_A}$ represented by the block 8.

The table illustrated in FIG. 3 shows the signal values which arise in successive keying periods $1/f_A$ for the fractional control provided by the circuit of FIG. 2. In this example and in all following examples, the contents of the phase accumulator is zero at start and the following conditions prevail $$f_O = 9.1 \text{ MHz}; f_T = f_A = 1 \text{ MHz}; F = 9.1$$

Figure 4:
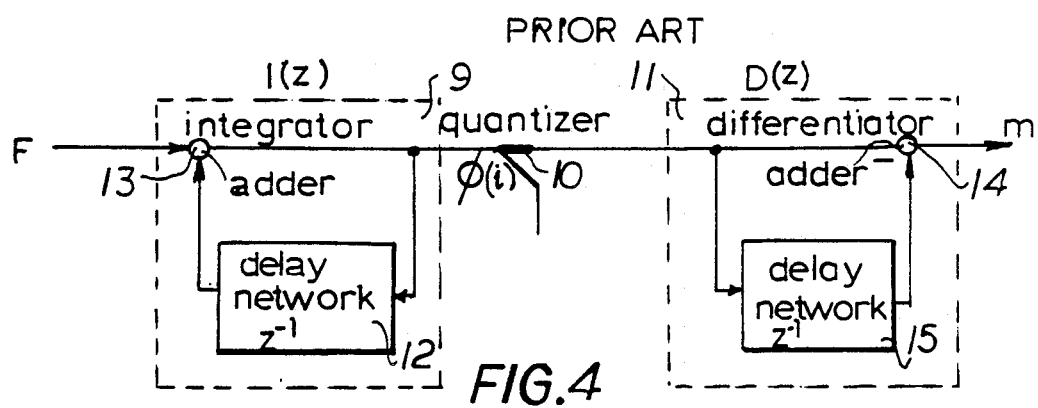
FIG. 4 is a block circuit diagram of a frequency divider control utilizing an integrator, a differentiator and a quantizer forming the phase accumulator and also belonging to the prior art.

FIG. 4 shows a somewhat different phase accumulator utilizing prior art principles and functioning as in digital filters. The effect, however, is the same as that of the phase accumulator of FIGS. 2 and 3.

The frequency setting information F is fed through an integrator 9 with the transfer function I(z) with a normalized phase $\phi(i)$ output.

The quantizer 10 splits the integral or whole-number component of this phase, i.e. whole oscillations. The integral component is subjected to differentiation in a differentiator 11 with the transfer function D(z) again into a normalized frequency and thus provides a sequence of frequency divider factors m=m(i) which are fed directly to the frequency divider. Upon differentiation, however, the value remains an integral or whole number value The frequency information F sets the normalized phase increase per keying period ($1/f_A$). The computer clocking frequency for the integrator and differentiator corresponds effectively to the keying frequency $f_A$.

The integrator 9 is provided with a delay network 12 and an adder 13 which sums the input signal with an output signal delay by the clock period. The delay clocking frequency the the frequency divider $f_T$ which efficiently corresponds to the keying frequency $f_A$. When the delay network 12 has a transfer function $z^{-1}$, the transfer function of the integrator will be $$I(z) = \frac{1}{1 - z^{-1}}$$

which has as one pole of the transfer function $z = 1$ (the poles corresponding to $f = kf_A$ with $k = 0, 1, ...$). The transfer function is obtained because of the following relationships at the adder 13

$$y(i) = x(i) + y(i - 1)$$
$$= x(i) + z^{-1}y(i)$$

where the input signal is x(i) and the output is y(i), giving a quotient y(i)/x(i).

The differentiator 11 with the transfer function D(z) comprises a delay network 15 and an adder 14 having a negative input signal from the delay network at the clock frequency. The transfer function thus is represented by $D(z) = 1 - z^{-1}$ which has a zero passage at $z = 1$. The transfer function of the differentiator is inverse to that of the integrator. This so-called digital filter for the control of a fractional frequency divider as shown by the circuit of FIG. 4 can be described by the following set of relations. The table of FIG. 5 shows the calculations which are obtained in this manner and in this case as well phi at the beginning is zero.

As a practical matter, the use of the frequency divider circuit controlled by a digital filter of the type shown in FIG. 4 has the disadvantage that the adder and the delay network must have a sufficient word spread that the integral increases monotonically with positive frequency For many applications, the above-described fractional principle generates phase variations which are not acceptable.

It is especially detrimental in many cases when the fractional component of the frequency information is very small, i.e. relatively close to a whole number frequency division setting since in that case, the greater part of the perturbation is of such low frequency that a filter or a PLL can hardly suppress the distortions and these distortions are applied in a non-attenuated fashion to the VCO. Less critical cases also arise when the fractional phase perturbations in $f_T$ deviate widely from $f_A$ and these, therefore, need not be dealt with which can reduce these phase perturbations as has generally been mentioned previously In German Patent Document DE-AS 22 40 216, therefore, a system is described in which the phase information in the phase accumulator is transformed by the digital-to-analog converter into a compensation voltage which compensates the output of the phase meter for the perturbation voltages by a corresponding sign-correct addition.

In German Open Application DE-OS 32 10 048, the output pulses carrying the phase distortions of a frequency divider are delayed before reaching the phase meter with the aid of a controlled transit by network so as to become equidistant. For each keying frequency period, a delay circuit is adjusted via the voltage of a digital-to-analog converter that the pulses outputted by the VCO reach the phase meter in a uniform manner. The necessary delay is proportional to the contents of the phase accumulator. The adjustable delay circuit can be inserted ahead of or subsequent to the programmable divider.

With both of these systems, the phase errors are compensated by analog means. The effectiveness of the compensation thus depends upon the linearity and slope variations of the compensating circuitry.

Figure 6:
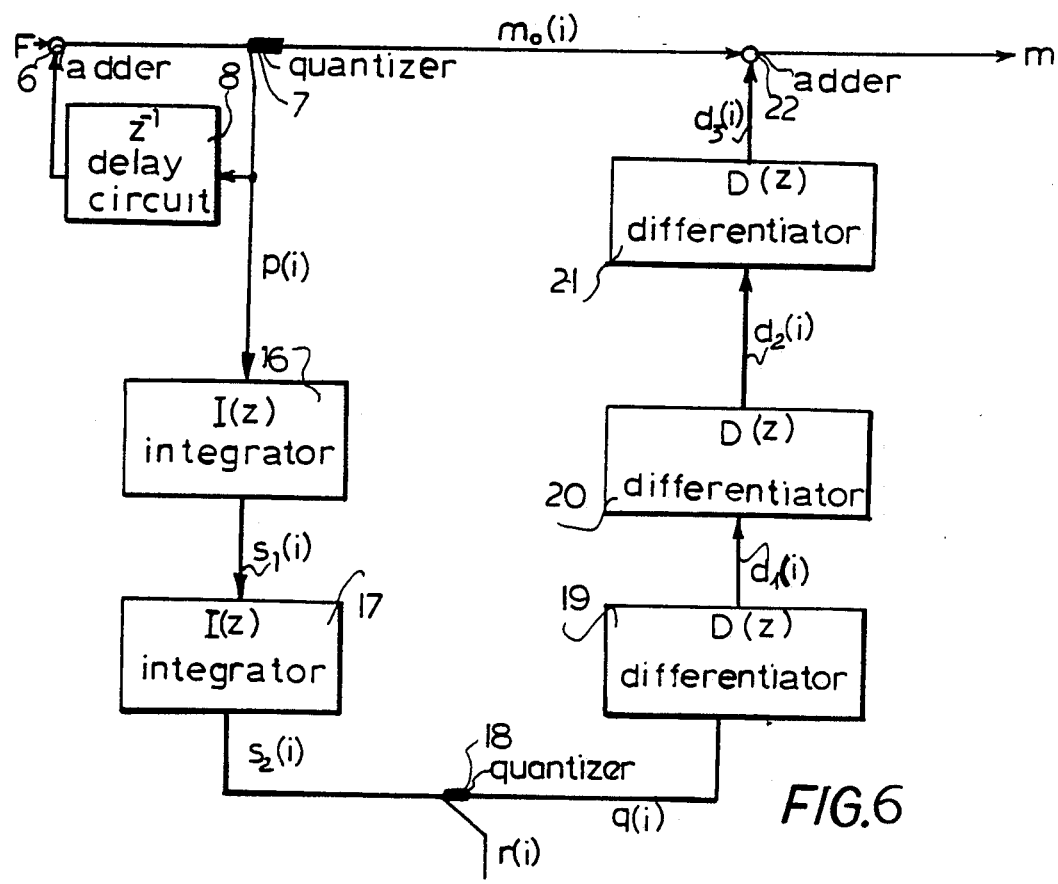
FIG. 6 is a block circuit diagram of a frequency controller in accordance with the invention having n=2 integrators and three differentiators in accordance with a preferred embodiment of the invention.

Turning then to the system of the invention, it can be seen from FIG. 6 that the control circuit for a frequency divider arrangement for calculating the frequency divider factor m utilizes a phase accumulator, two integrators, a quantizer for whole oscillation and three differentiators (n=2). The fractional phase p(i) which is calculated by the phase accumulators 6, 7 and 8 consisting respectively of the adder 6, the quantizer 7 and the delay circuit operating in the manner previously described, integrated in the two integrators 16 and 17 and is split in the quantizer 18 into an integral or whole-number value q(i). This signal is differentiated three times in the differentiators 19, 20 and 21 and the output from the differentiators is applied to an adder 22 which sums the whole number or integral output of the phase accumulator $m_o(i)$ with the differentiator output $d_3(i)$ to yield the sequence of frequency divider factors $m = m(i)$.

This system operates under the following set of equations:

| | |
|---|---|
| $F = f_O/f_A$ | (Normalization) |
| $p(i) = (p(i - 1) + F) \bmod 1$ | (Phase Accumulation) |
| $s_1(i) = s_1(i - 1) + p(i)$ | (1. Integration) |
| $s_2(i) = s_2(i - 1) + s_1(i)$ | (2. Integration) |
| $q(i) = s_2(i) - (s_2(i) \bmod 1)$ | (Quantization) |
| $d_1(i) = q(i) - q(i - 1)$ | (1. Differentiation) |
| $d_2(i) = d_1(i) - d_1(i - 1)$ | (2. Differentiation) |
| $d_3(i) = d_2(i) - d_2(i - 1)$ | (3. Differentiation) |
| $m(i) = (p(i - 1) + F) - ((p(i - 1) + F) \bmod 1) + d_3(i)$ | (Division Factor) |

The tables shown in FIG. 7 represent the operation of the circuit of FIG. 6 for the frequency information $F = 9.1$ and illustrating the sequence of frequency division factors. The last column entitled "phase error" illustrates the absolute phase error present in the frequency divider output signal. It is a result of the fact that the fractional component r(i) split off by the quantizer 18 is twice differentiated when after a phase accumulation, two integrations and two differentiations, a phase value is obtained. In this example, the absolute error of the phase increases: $1.1 - (1.2) = 2.3$ divider input periods.

According to a feature of the invention, the integrated value is calculated with a reduced wide length by operating upon a fractional part thereof. The final precision with respect to the decimal places after an integration with reduced distortion of $f_T$ will be greater as the integral is increased for example, $s_{2(i)}$ fewer decimal places than $s_{1(i)}$ exist, which generally can be considered in terms of ambient noise as $s_{r(i)}$ when one carries out r differentiations, in the normalized perturbation phase of $f_T$. Each of these differentiations has approximately $f = kf_A$ damping $k = 0, 1, 1 \ldots$ Such rounding off can give rise to another sequence of frequency divider factors m.

A further embodiment of the invention makes use of a system in which instead of two or more integrators, other filter functions with at least two poles of the transfer function with $f = 0$ and $2 = 1$ and instead of the three or more differentiators, other filter functions with whole coefficients and at least one zero setting of the transfer function at $f = 0$ or $2 = 1$ are used. A predistortion of the frequency divider factor m can also be achieved, therefore, by a controlled filter which does not only have poles and zero settings at $2 = 1$. With a similar effect, the integrator and differentiator can operate in accordance with the relationship $$I^*(z) = \frac{1}{1 - z^{-\nu}} = \frac{1}{D^*(z)} \; ; (\nu = E\{1, 2, \ldots\})$$

where the recursion equation of the integrator $$y^*(i) = x^*(i) + y^*(i - \nu)$$
$$= x^*(i) + z^{-\nu_0} y^*y(i)$$

These filters have ν poles or zero settings in the unit circle ($|z| = 1$). This, of course, yields another sequence of the frequency divider factors m. Here the peak-to-peak values of the phase perturbations are greater than the values obtained with the embodiment of FIG. 6.

It will be apparent that the integrators will always show increasingly greater signal values at their outputs. However, these signal values arise only internally. In practice, one can simply effect resetting of the integrators after a certain time which can mean a brief interruption of the switching function or one can tie the integrators or differentiators together for the whole values. This corresponds to a foreshortening so that progressively increasing signal values will never arise.

It is also possible in accordance with the invention for generating a desired frequency to calculate the required sequence in a register or memory and periodically read them from the memory without requiring continuations standardization and recalculation with a digital filter.

Figure 8:
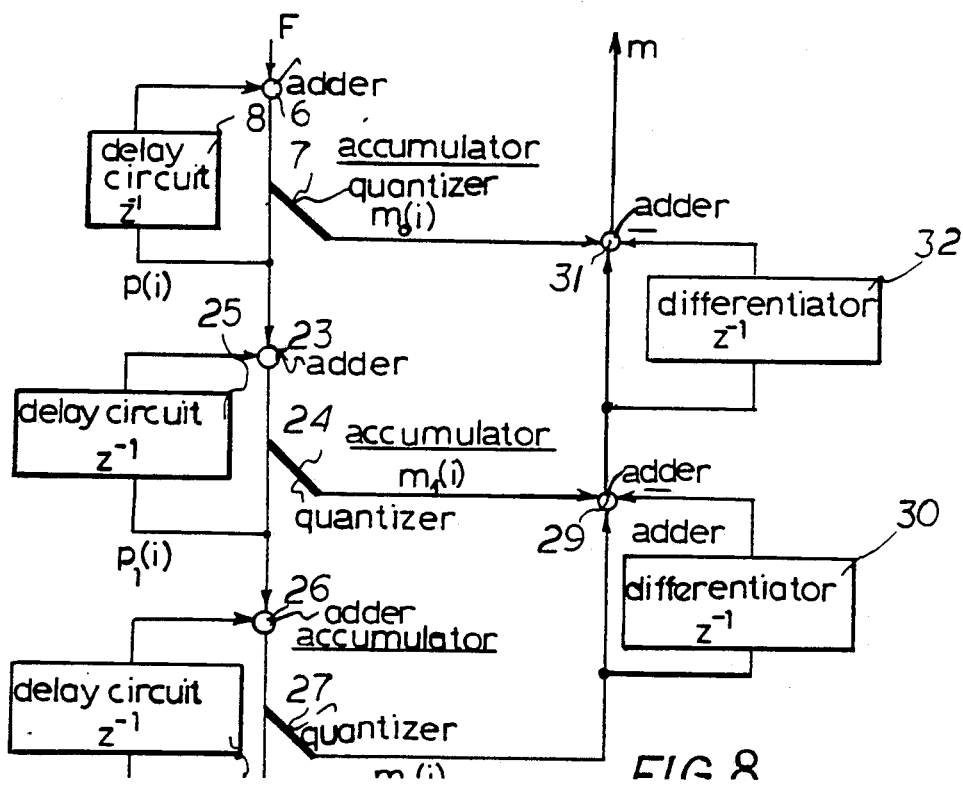
FIG. 8 is a block circuit diagram of another embodiment of this invention with a frequency divider circuit with shortening of the whole number integral with differentiation.

FIG. 8 illustrates another embodiment of the invention with shortening of the whole-number component of the integral with subsequent differentiation. Here the integrators 16 and 17, the quantizer 18 and the differentiator 19 of FIG. 6 are replaced by two accumulators providing three accumulators in series of which one is formed by the adder 6, the delay 8 and the quantizer 7 previously described, another is formed by the adder 23, the delay 25 and the quantizer 24 and the third is formed by the adder 26, the delay 28 and the quantizer 27, and only two differentiators 29 -32 are required. The integrator 16 of FIG. 6 is replaced by the accumulators 23-25, whose whole-number output is applied to an adder 29. The adders 29 and 31 each have three inputs of which one input has a negative sign receiving the delayed signals from the time delay networks 30 and 32 which form the differentiating function.

At the adders and delay networks of the circuit of FIG. 8 amplitude-limited signal values are exclusively obtained which are particularly effective for real-time calculations. The table of FIG. 9 shows the results obtained with the operation of the circuit of FIG. 8 for $f = 9.1$.

A comparison of the values tabulated in FIGS. 7 and 9 shows the effect of the circuits in FIGS. 6 and 8 are the same. The signal $p_2(i)$ obtained in FIG. 8 is the equivalent of the signal r(i) obtained in the circuit of FIG. 1 where after double differentiation again results in the same phase error.

To further reduce the phase distortion, conventional analog compensating circuitry can be added.

I claim:

1. In a frequency divider method for generating a frequency $f_T$ from a given frequency $f_O$ with a frequency divider settable only to whole-number divisor factors m and wherein on the average for a whole or fractional frequency division ratio is realized by a new setting of m to correspond to a frequency-setting information datum, a control circuit being provided which includes a phase accumulator applied with the fractional component of the frequency-setting datum and clocked by the divider output signal $f_T$ or a signal synchronous therewith and for each frequency-division cycle a new value m is supplied, the sequence of frequency-divider factors m being calculated in real time or read from a memory when the sequence is periodic and the terms of the sequence each have two components of which a first component is constituted of the sum of the whole parts of the frequency-setting information F and is a transfer from the phase accumulator, a second of said components being calculated from the stored contents of the phase accumulator, the improvement which comprises calculating the second component, in order to reduce the spectral part of the phase perturbations falling in the vicinity of $f_T$ in consideration of the more remote spectral parts and an increase in the absolute value of the phase perturbations to greater than $2(n-1)$ periods $1/f_O$ measured peak-to-peak, with the following steps:

integrating the contents of the phase accumulator n times, where $n=2, 3, \ldots$, in digital integrators with the input x and the output y defined by the recursion formula $y(i)=y(i-1)+x(i)$ to provide an integrated result;

cutting off said integrated result to yield an integer value; and differentiating the integer value $n+1$ times in digital differentiators with the input x and the output y defined by the formula $y(i)=x(i)-x(i-1)$, the integrators, the differentiators and the phase accumulator being operated synchronously with the same computing cycle.

2. The frequency divider method defined in claim 1 wherein the integrated value is calculated with a reduced word length by operating upon a fractional part thereof.

3. The frequency divider method defined in claim 1 wherein the contents of the phase accumulator n is integrated in at least two integrators and the integrated value is differentiated in at least three differentiators.

4. The frequency divider method defined in claim 2 wherein lower value settings of the fractional part of the integrated values are calculated at a reduced cycling frequency.

5. The frequency divider method defined in claim 1 which forms an adjustable frequency divider in a phase-control loop of a frequency synthesizer.

6. The frequency divider method defined in claim 1 which generates a frequency by dividing the frequency $f_O$ and subsequently subjects the divided frequency $f_T$ to pass-band filtration.

7. The frequency divider method defined in claim 1 wherein the integration is foreshortened with the differentiation for whole values of the integrated value.

8. In a frequency divider method for generating a frequency $f_T$ from a given frequency $f_O$ with a frequency divider settable only to whole-number divisor factors m and wherein on the average for a whole or fractional frequency division ratio is realized by a new setting of m to correspond to a frequency-setting information datum, a control circuit being provided which includes a phase accumulator supplied with the fractional component of the frequency-setting datum and clocked by the divider output signal $f_T$ or a signal synchronous therewith and for each frequency-division cycle a new value m is supplied, the sequence of frequency-divider factors m being calculated in real time or read from a memory when the sequence is periodic and the terms of the sequence each have two components of which a first component is constituted of the sum of the whole parts of the frequency-setting information F and is a transfer from the phase accumulator, a second of said components being calculated from the stored contents of the phase accumulator, the improvement which comprises calculating the second component, in order to reduce the spectral part of the phase perturbations falling in the vicinity of $f_T$ in consideration of the more remote spectral parts and an increase in the absolute value of the phase perturbations to greater than $2(n-1)$ periods $1/f_O$ measured peak-to-peak, with the following steps:

subjecting the contents of the phase accumulator to digital filtration with a transfer function having at least two poles and with $f=0$ and $z=1$ to provide an integrated result;

cutting off said integrated result to yield an integer value; and subjecting the integer value to digital filtration with a filter function having integral coefficients and at least two zero crossings of a transfer function with $f=0$ and $z=1$, the digital filtrations and the phase accumulator being operated synchronously with the same computing cycle.

9. A frequency divider circuit for generating a frequency $f_T$ from a given frequency $f_O$, comprising:

a frequency divider settable only to whole-number divisor factors m and wherein on the average for a whole or fractional frequency division ratio is realized by a new setting of m to correspond to a frequency-setting information datum; and a control circuit including a phase accumulator operatively connected to said frequency divider and supplied with the fractional component of the frequency-setting information datum and clocked by the divider output signal $f_T$ or a signal synchronous therewith and for each frequency-division cycle supplying a new value m, the sequence of frequency-divider factors m being calculated in real time or read from a memory when the sequence is periodic and the terms of the sequence each having two components of which a first component is constituted of the sum of the whole parts of the frequency-setting information F and is a transfer from the phase accumulator, and of which a second component is calculated from the stored contents of the phase accumulator, said control means further comprising means whereby the second component, in order to reduce the spectral part of the phase perturbations falling in the vicinity of $f_T$ in consideration of the more remote spectral parts and an increase in the absolute value of the phase perturbations to greater than $2(n-1)$ periods $1/f_O$ measured peak-to-peak, is calculated as follows:

integrating the contents of the phase accumulator n times, where $n=2, 3, \ldots$, in digital integrators with the input x and the output y defined by the recursion formula $y(i)=y(i-1)+x(i)$ to provide an integrated result;

cutting off said integrated result to yield an integrated value; and differentiating the integrated value $n+1$ times in digital differentiators with the input x and the output y defined by the formula $y(i)=x(i)+x(i-1)$, the integrators, the differentiators and the phase accumulator being operated synchronously with the same computing cycle.

10. The frequency divider circuit defined in claim 9 wherein the integrated value is calculated with a reduced word length by operating upon a fractional part thereof.

11. The frequency divider circuit defined in claim 9 wherein the contents of the phase accumulator n is integrated in at least two integrators and the the integrated value is differentiated in at least three differentiators.

12. The frequency divider circuit defined in claim 10 wherein lower value settings of the fractional part of the integrated values are calculated at a reduced cycling frequency.

13. The frequency divider circuit defined in claim 9 which forms an adjustable frequency divider in a phase-control loop of a frequency synthesizer.

14. The frequency divider circuit defined in claim 9 which generates a frequency by dividing the frequency $f_O$ and subsequently subjects the divided frequency $f_T$ to pass-band filtration.

15. The frequency divider circuit defined in claim 9 wherein the integration is foreshortened with the differentiation for whole values of the integrated value.

* * * * *